United States Patent [19]

Gasparik

[11] Patent Number: 5,491,429
[45] Date of Patent: Feb. 13, 1996

[54] APPARATUS FOR REDUCING CURRENT CONSUMPTION IN A CMOS INVERTER CIRCUIT

[75] Inventor: Frank Gasparik, Monument, Colo.

[73] Assignees: AT&T Global Information Solutions Company, Dayton, Ohio; Hyundai Electronics America, Milpitas, Calif.; Symbios Logic Inc., Fort Collins, Colo.

[21] Appl. No.: 307,111

[22] Filed: Sep. 16, 1994

[51] Int. Cl.$^6$ ............................................. H03K 19/003
[52] U.S. Cl. .............................................. 326/27; 326/121
[58] Field of Search ................................ 326/27, 121

[56] References Cited

U.S. PATENT DOCUMENTS

| | | | |
|---|---|---|---|
| 4,827,159 | 5/1989 | Naganuma | 326/27 |
| 4,870,609 | 9/1989 | Yasui et al. | 364/784 |
| 4,972,101 | 11/1990 | Partovi et al. | 307/443 |
| 5,034,629 | 7/1991 | Kinugasa et al. | 326/121 X |
| 5,051,625 | 9/1991 | Ikeda et al. | 326/27 |
| 5,073,727 | 12/1991 | Shizu et al. | 307/451 |
| 5,075,570 | 12/1991 | Shewchuk et al. | 307/279 |
| 5,179,297 | 1/1993 | Hsueh et al. | 307/296.6 |
| 5,187,686 | 2/1993 | Tran et al. | 365/189.11 |
| 5,198,699 | 3/1993 | Hashimoto et al. | 326/121 X |
| 5,281,869 | 1/1994 | Lundberg | 307/443 |
| 5,296,757 | 3/1994 | Koizumi | 326/121 X |
| 5,302,920 | 4/1994 | Bitting | 331/45 |

FOREIGN PATENT DOCUMENTS

| | | | |
|---|---|---|---|
| 404094213 | 3/1992 | Japan | 326/27 |
| 404144421 | 5/1992 | Japan | 326/27 |
| 404178014 | 6/1992 | Japan | 326/27 |

*Primary Examiner*—David R. Hudspeth
*Attorney, Agent, or Firm*—Wayne P. Bailey

[57] ABSTRACT

A method and system for reducing pass-through current. The amount of simultaneous current flow through p-channel and n-channel devices of a CMOS inverter is reduced. This results in an increase in the power efficiency of CMOS oscillators, inverters, gates and other CMOS circuits. Another benefit of this invention is the increase of the output signal magnitude. This increase in the output signal with the lower power consumption yields a significantly higher efficiency of the CMOS circuit such as an oscillator.

2 Claims, 4 Drawing Sheets

5,491,429

APPARATUS FOR REDUCING CURRENT CONSUMPTION IN A CMOS INVERTER CIRCUIT

TECHNICAL FIELD

The present invention relates to CMOS integrated circuit devices, and more particularly to a CMOS inverter integrated circuit having reduced power consumption.

BACKGROUND OF THE INVENTION

In conventional CMOS devices, such as inverters and logic gates, both p-channel and n-channel devices go through a linear region when both devices are "on" during the switching transient. The drain current which passes through both devices from power supply to ground is wasted ("pass-through" current). The pass-through current can be accurately determined by transient analysis simulation of such circuits without load, while monitoring the power supply current. The typical pass-through current of an inverter is shown at 6 in FIG. 1, which is a plot of pass-through current vs. time.

This problem is further compounded in a design of circuits operating at slower clock speeds of hundreds of kHz manufactured in short channel CMOS technology. This technology is capable of operating with clock speeds in the hundreds of MHz range, with gate delays of less than one nanosecond. The slower clock speeds cause an increase in the amount of time that the p-channel and n-channel devices are both "on", i.e. being "on" longer results in a greater time for current to flow from the power supply voltage to ground.

This problem is well illustrated in an oscillator circuit which is battery powered, and where the power consumption is one of the most critical parameters. Such application for a battery powered oscillator may be found in a pen-based computer, where the pen transmits signals which are used for position reconciliation between the pen and a pad or template. The frequency of the oscillator used in the pen is defined by external components. The signal waveform is sinusoidal.

It is an object of the present invention to provide an improved inverter circuit.

It is yet another object of the present invention to provide an improved CMOS inverter circuit.

It is yet another object of the present invention to provide an inverter circuit having reduced power consumption.

It is a further object of the present invention to provide an improved inverter circuit for use in an oscillator.

It is still another object of the present invention to provide circuits for reducing power dissipation in a electrical/electronic stylus such as a pen in a pen-based computer.

SUMMARY OF THE INVENTION

The present invention is a method and system for reducing pass-through current. The amount of simultaneous current flow through p-channel and n-channel devices of a CMOS inverter is reduced. This results in an increase in the power efficiency of CMOS oscillators, inverters, gates and other CMOS circuits.

Another benefit of this invention is the increase of the output signal magnitude. This increase in the output signal with the lower power consumption yields a significantly higher efficiency of the CMOS circuit such as an oscillator.

DETAILED DESCRIPTION OF THE PREFERRED EMBODIMENT

Figure 1:
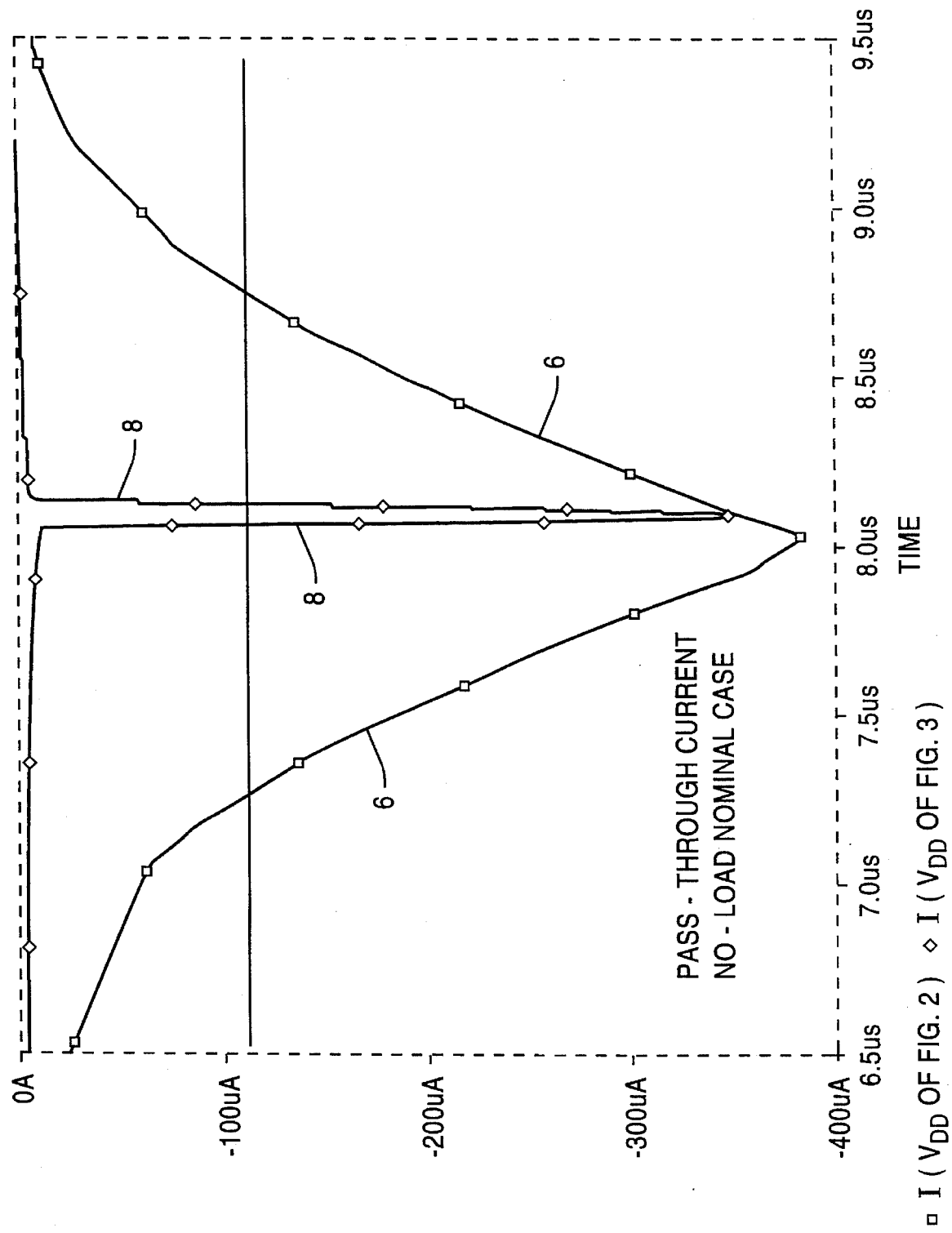
FIG. 1 is a graphical depiction of the power consumption for the circuits of FIGS. 2 and 4.
Figure 2:
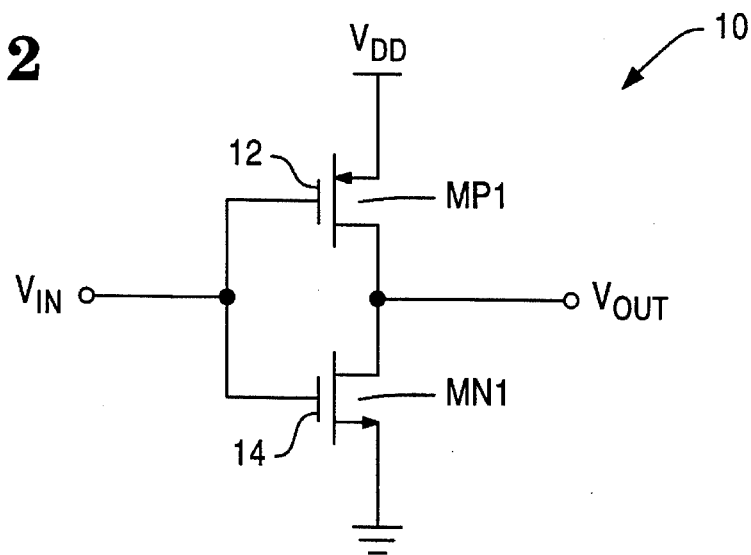
FIG. 2 is a schematic for a CMOS inverter.

First consider the present-art inverter circuit 10 with no load, depicted in FIG. 2. A plurality of these inverter circuits are traditionally used as delay stages of a ring oscillator, one such oscillator being described in U.S. Pat. No. 5,302,920 entitled "Controllable Multi-Phase Ring Oscillators with Variable Current Sources and Capacitances", which is hereby incorporated by reference. Both p-channel 12 and n-channel 14 devices, also known as field-effect transistors (FETs), are driven with a time-varying input signal applied simultaneously to both gates. A low-to-high transition of the input signal ViN will first be described. When the input signal VIN is in the low state, the p-channel device 12 is fully "on" and the n-channel device 14 is fully "off", thus interrupting the current flow from the power supply voltages VDD and GROUND. During the low-to-high transition of the input signal, as the input signal reaches the threshold voltage of the n-channel device 14, MN1 begins to conduct and sink the current provided by the MP1 device. The pass-through current through MN1 will increase to its maximum approximately when the input signal is passing through the inverter's trip point. Further increase of the input voltage will decrease the available current from the MP1 device, which is being turned "off". The approximate shape of the pass-through current versus time is a triangle, as shown at 6 in FIG. 1. The average current can be determined by the area of the triangle divided by the half-period of the input signal. The half-period is used due to the fact that the pass-through current flows twice during each period.

Figure 3:
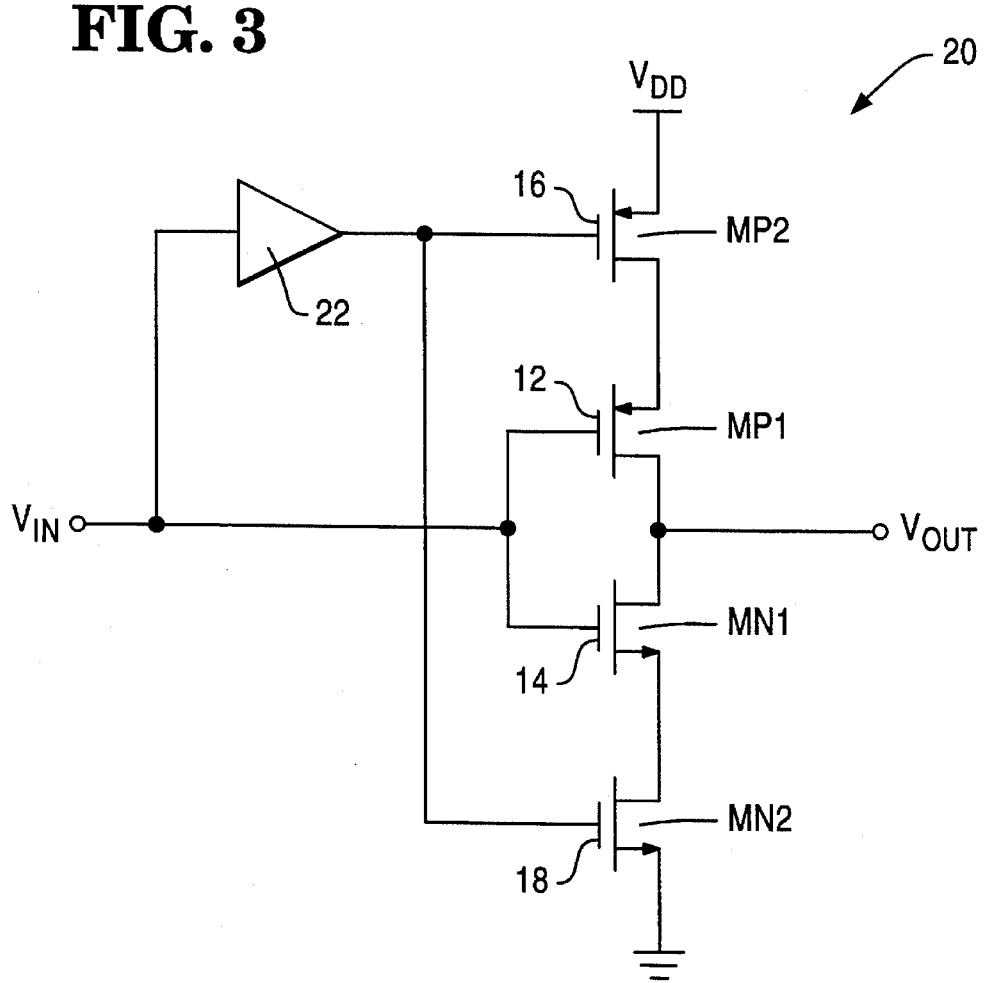
FIG. 3 is a schematic for an improved CMOS inverter with reduced power consumption.
Figure 4:
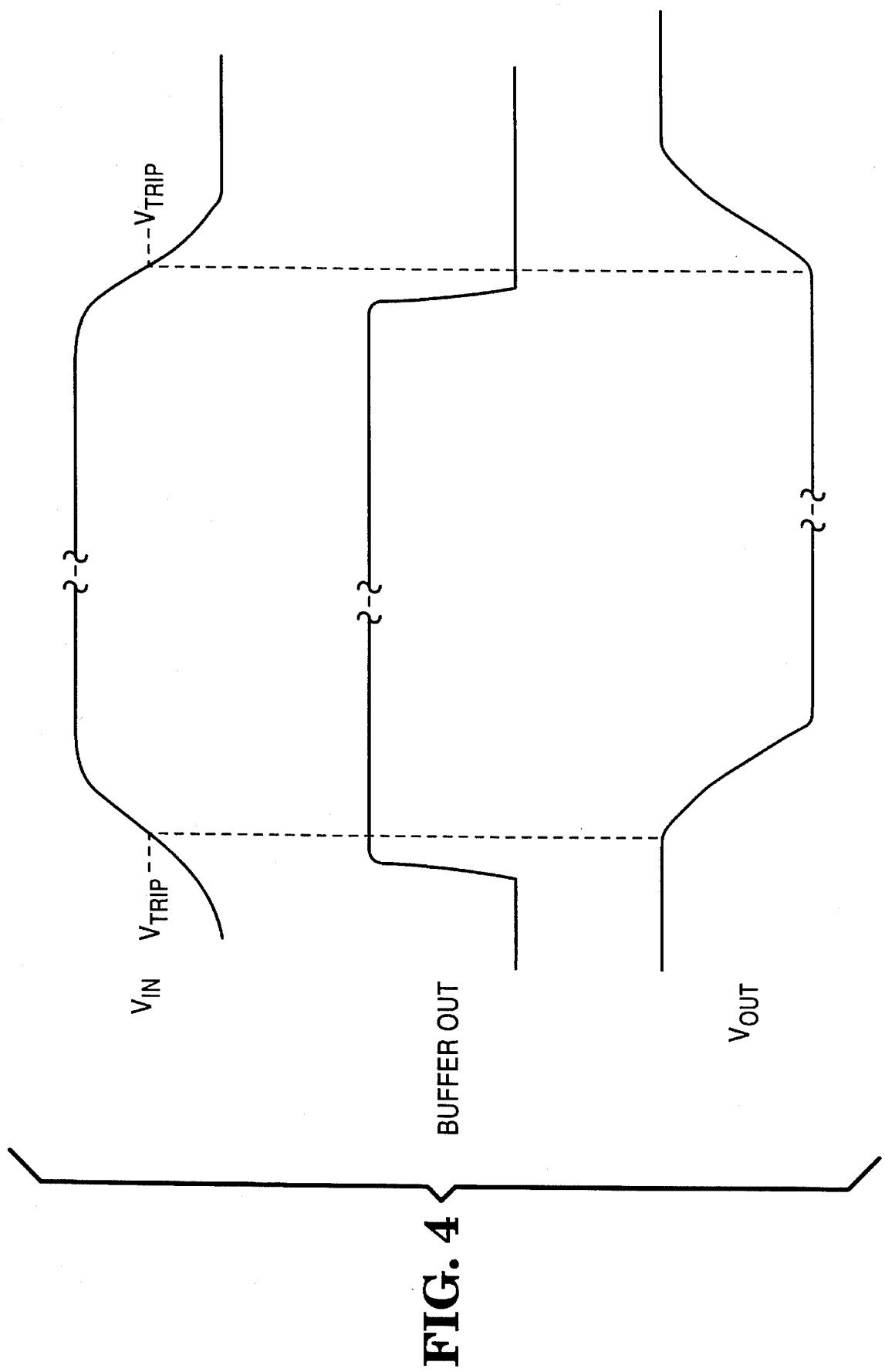
FIG. 4 is a timing diagram for the circuit of FIG. 3.

In order to interrupt the flow of the "pass-through" current, a pair of MP2 and MN2 devices 16 and 18 are inserted in the circuit as shown in FIG. 3. These two devices are connected in series with the MP1 and MN1 devices. The gates of both MP2 and MN2 devices are controlled by the buffer 22. It is important to note that the propagation delay of buffer 22 is significantly shorter than the transition time of the MP1/MN1 inverter 10. As the input signal ViN starts to rise slowly during the low-to-high transition, buffer 22 will convert it to a fast rising pulse appearing at its output, thus serving as a wave-shaping circuit (as shown by the BUFFER OUT signal of FIG. 4). This fast pulse will turn off the MP2 device long before the MP1/MN1 inverter reaches its trip point ($V_{TRIP}$ of FIG. 4), and the flow of the pass-through current is prevented. A similar sequence of events will take place for the high-to-low transition of the input signal. Buffer 22 will turn off the MN2 device before the MP1/MN1 inverter's trip point ($V_{TRIP}$) is reached, and again this will suppress the flow of pass-through current for the negative transition of the input signal.

The trip point of the inverter is normally ½ VDD, but yet this value has no critical bearing on the design. The critical part of the design is that buffer 22 is faster (i.e. has a shorter propagation delay) than the transition time of the MP1/MN1 inverter input signal.

The elimination or suppression of the pass-through current results in a significant reduction of power consumption. This increases the lifetime of the power supply for battery powered systems (such as pen in a pen-based computer), or in a reduction of power consumption in environmentally sound products such as the so-called "Green PC". The calculated power reduction is more than 40% in the case of the pen oscillator. The increase in the power efficiency depends upon the relative difference in speed of the system and the CMOS technology used to manufacture the system. The faster the CMOS technology becomes with submicron geometries, the more power can be saved for the slower operating sections of the system. This is due to the fact that faster CMOS technologies have shorter channel lengths and are thus capable of larger current drive for the same channel width (i.e. results in larger "pass through" currents).

A second important aspect of this invention is the increase of the output signal magnitude. In my example, the $V_{OUT}$ amplitude increase amounts to approximately 10%. This increase is a side benefit of the suppression of the pass-through current. The load (not shown) is charged/discharged with all the current provided by the driving/sinking device MP1/MN1, without the loss caused by the pass-through current, which is normally robbing a portion of the driver's current. The percentage of the improvement will vary with the difference in the speed of the particular circuit using this invention and the applied CMOS technology. With a faster CMOS technology the improvement can be much greater.

Figure 5:
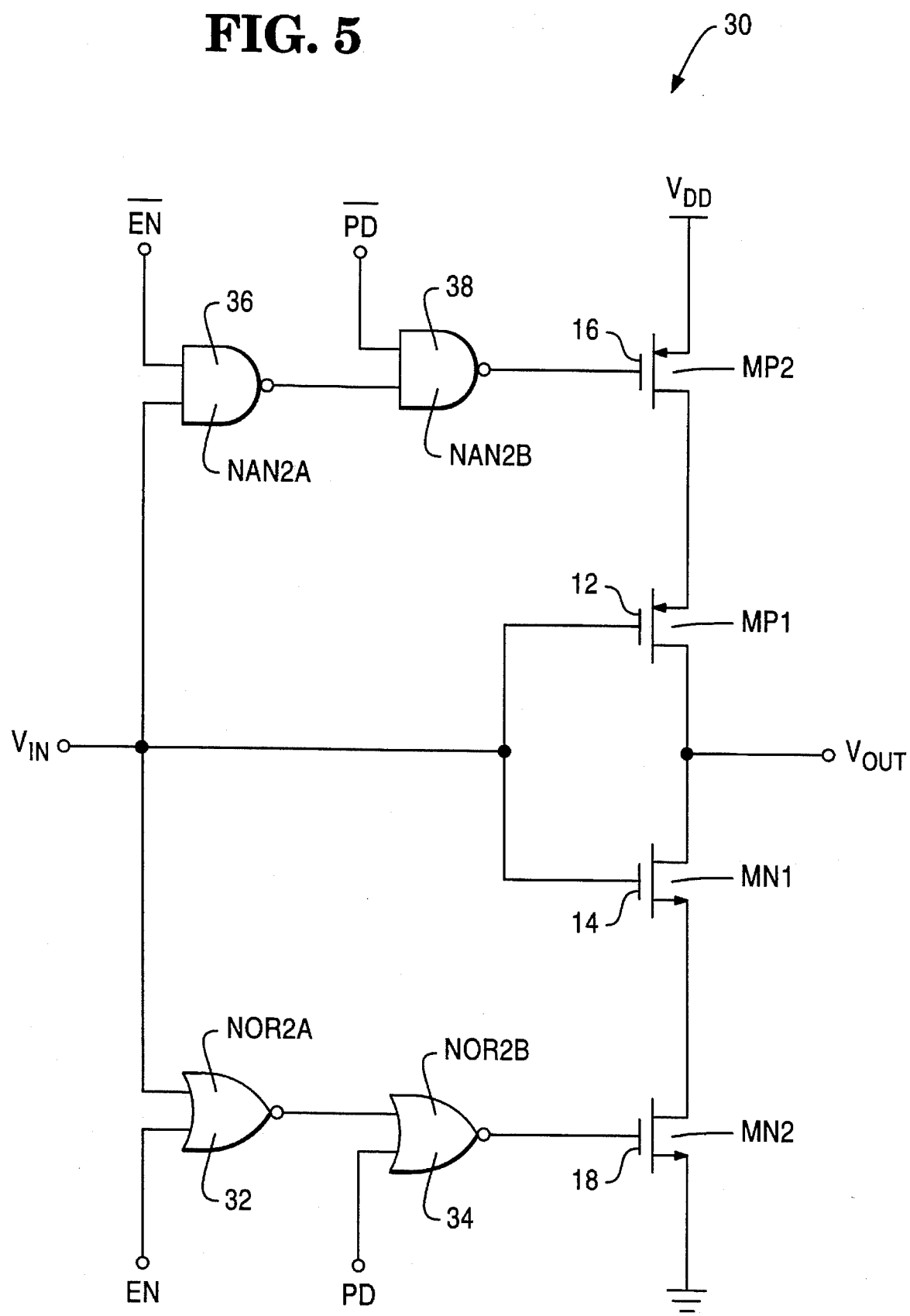
FIG. 5 is a schematic for an improved low power CMOS inverter with tri-state capability.

A modified circuit implementation is shown in FIG. 5 for a case when an inverter/driver circuit needs to be tri-stated. The proper polarity of the controlling signals is achieved by two stages of NAND and NOR gates.

As mentioned before, the buffer of FIG. 3 must be substantially faster than the inverter input signal $V_{IN}$ transition time. In like manner, the controlling logic (i.e. the NAND and NOR gates) in FIG. 5 must be substantially faster than the inverter input signal $V_{IN}$ transition time. This is achievable notwithstanding the longer channel lengths of these additional devices, since the transition times of output transistors MP1 and MN1 are inherently slower than the transition times of standard NAND and NOR gates used in the industry.

The operation of FIG. 5 is shown below, with reference to the truth table shown in Table 1.

TABLE 1

| MODE | PD | EN | $\overline{PD}$ | $\overline{EN}$ |
|---|---|---|---|---|
| Low-Power | L | L | H | H |
| Tri-State | H | X | L | X |
| High-Power | L | H | H | L |

To activate the low-power mode, the power-down signal PD is set LOW (and with the inverted PD signal, $\overline{PD}$, accordingly being set HIGH), and the enable signal EN is set LOW (and with the inverted EN signal, $\overline{EN}$, accordingly being set HIGH). This will result in NOR2A gate 32 and NOR2B gate 34 passing the input signal ViN to the gate of transistor MN2. In similar fashion, NAN2A gate 36 and NAN2B gate 38 will pass the input signal $V_{IN}$ to the gate of transistor MP2. The circuit thus operates in a manner similar to that of FIG. 3.

To activate tri-state mode, the power-down signal PD is set HIGH (and with the inverted PD signal, $\overline{PD}$, accordingly being set LOW). This results in a LOW voltage level being output from NOR2B gate 34, thus turning "off" transistor MN2. Similarly, this results in a HIGH voltage level being output from NAN2B gate 38, thus turning "off" transistor MP2. Since transistors MP2 and MN2 are both "off", the output Vout will be tri-stated.

If for some reason it is desired to place the circuit of FIG. 5 in a normal, or high-powered, mode, for example to test/compare the power consumption both with and without the power-saving techniques described herein, a high-power mode is provided. Setting PD "low" and EN "high" results in the output of the NOR2A gate being "low", and the output of the NOR2B gate 34 being "high". This turns on transistor MN2, which in effect ties the source of MN1 to GROUND. In similar fashion, the output of the NAN2A gate 36 is "high", and the output of the NAN2B gate 38 is "low". This turns on transistor MP2, which in effect ties the source of MP1 to VDD. Thus, the circuit is configured to operate in a similar fashion to inverter 10 of FIG. 2.

In summary, by providing an additional p-channel and n-channel transistor in series with the existing p-channel and n-channel transistor pair inverter, it is possible to reduce or eliminate the amount of time that the inverter's transistors are simultaneously "on", and thus reduce the amount of current flow from VDD to GROUND.

While I have illustrated and described the preferred embodiments of my invention, it is to be understood that I do not limit myself to the precise constructions herein disclosed, and the right is reserved to all changes and modifications coming within the scope of the invention as defined in the appended claims.

I claim:

1. A circuit for reducing power consumption, comprising:
an inverter comprising a p-channel and n-channel transistor, said inverter having an input and output;
a buffer having an input and output, the buffer input being coupled to the inverter input;
a second p-channel transistor having its gate coupled to the buffer output, its source coupled to a supply voltage, and its drain coupled to the inverter p-channel's drain.

2. The circuit of claim 1 further comprising a second n-channel transistor having its gate coupled to the buffer output, its source coupled to a second supply voltage, and its drain coupled to inverter n-channel's source.

* * * * *